United States Patent [19]

Murphy

[11] Patent Number: 5,381,056

[45] Date of Patent: Jan. 10, 1995

[54] CMOS BUFFER HAVING OUTPUT TERMINAL OVERVOLTAGE-CAUSED LATCH-UP PROTECTION

[75] Inventor: Brian Murphy, Brombach, Germany

[73] Assignee: Siemens Aktiengesellschaft, Munich, Germany

[21] Appl. No.: 121,725

[22] Filed: Sep. 15, 1993

[30] Foreign Application Priority Data

Sep. 16, 1992 [EP] European Pat. Off. ......... 92115841.6

[51] Int. Cl.6 .......................................... H03K 19/003
[52] U.S. Cl. ........................................ 326/21; 361/91; 326/68; 326/121; 327/534; 327/546
[58] Field of Search ................. 361/91; 307/443, 451, 307/475, 296.2, 296.5

[56] References Cited

U.S. PATENT DOCUMENTS

| | | |
|---|---|---|
| 4,039,869 | 8/1977 | Goldman et al. |
| 4,441,035 | 4/1984 | Demetrion ............... 307/296.5 |
| 4,473,758 | 9/1984 | Huntington ............. 307/451 X |
| 4,723,081 | 2/1988 | Akatsuka ................ 307/443 X |
| 4,806,801 | 2/1989 | Argade et al. ............. 307/475 |
| 5,057,715 | 10/1991 | Larsen et al. |
| 5,300,824 | 4/1994 | Iyengan .................. 307/296.3 |

OTHER PUBLICATIONS

IEEE Journal Of Solid-State Circuits, vol. 23, No. 3, Jun. 1988, New York (US) pp. 816-819 Pribyl et al. "CMOS Output Buffers for Megabit DRAM's".

*Primary Examiner*—David R. Hudspeth
*Attorney, Agent, or Firm*—Herbert L. Lerner; Laurence A. Greenberg

[57] ABSTRACT

A CMOS buffer circuit includes a p-channel MOS transistor having a source terminal connected to an operating voltage source and a substrate terminal connected to a pump voltage source. A first n-channel MOS transistor is connected in series with the p-channel MOS transistor and has a source terminal connected to a reference potential and a drain terminal connected to an output terminal. A second n-channel MOS transistor is connected between and in series with the p-channel MOS transistor and the first n-channel MOS transistor. The second n-channel MOS transistor has a gate terminal connected to the pump voltage source.

9 Claims, 1 Drawing Sheet

CMOS BUFFER HAVING OUTPUT TERMINAL OVERVOLTAGE-CAUSED LATCH-UP PROTECTION

BACKGROUND OF THE INVENTION

FIELD OF THE INVENTION

The invention relates to a CMOS buffer circuit having a p-channel MOS transistor with a source terminal connected to an operating voltage source and a substrate terminal connected to a pump voltage source, and an n-channel MOS transistor being connected in series therewith and having a source terminal connected to the reference potential and a drain terminal connected to the output terminal.

As can be learned, for instance, from an article entitled "CMOS Output Buffers for Megabit DRAM's" in the IEEE Journal of Solid-State Circuits, Vol. 23, No. 3, June 1988, a major problem with such CMOS circuits is that they have great sensitivity with respect to the so-called latch-up phenomenon.

In that process a parasitic thyristor can be fired if the voltage at the output terminal is greater than the sum of the operating voltage and the base-to-emitter voltage of a transistor, or less than the difference between the reference potential and the base-to-emitter voltage of a transistor.

Since firing of the parasitic thyristor would cause destruction of the chip on which the CMOS circuit is located, suitable provisions for preventing latch-up must be found.

It is conventional to connect the substrate terminal of the n-channel MOS transistor to a voltage that is less than or equal to the reference potential, and to connect the substrate terminal of the p-channel MOS transistor to a voltage that is greater than the operating voltage. In normal operation, that can prevent latch-up from occurring.

However, since the two substrate voltages are derived from the operating voltage and are generated by so-called pump circuits, a certain amount of time passes before the voltages have attained their final value after the operating voltage is turned on. During that time, firing of the parasitic thyristor continues to be possible, if a corresponding level is present at the output terminal of a CMOS buffer circuit.

SUMMARY OF THE INVENTION

It is accordingly an object of the invention to provide a CMOS buffer circuit, which overcomes the hereinafore-mentioned disadvantages of the heretofore-known devices of this general type and which prevents the occurrence of a latch-up even between the turn-on of the operating voltage and the onset of action of the pump voltages.

With the foregoing and other objects in view there is provided, in accordance with the invention, a CMOS buffer circuit, comprising a p-channel MOS transistor having a source terminal connected to an operating voltage source and a substrate terminal connected to a pump voltage source; a first n-channel MOS transistor being connected in series with the p-channel MOS transistor and having a source terminal connected to a reference potential and a drain terminal connected to an output terminal; and a second n-channel MOS transistor being connected between and in series with the p-channel MOS transistor and the first n-channel MOS transistor, the second n-channel MOS transistor having a gate terminal connected to the pump voltage source.

The second n-channel MOS transistor prevents a voltage which is present at the output terminal from being connected through to the p-channel MOS transistor, before the pump voltage has reached its nominal value. This reliably prevents latch-up.

In accordance with another feature of the invention, there is provided a first diode being polarized in the conducting direction and having a low threshold voltage, the first diode being connected between the source terminal and the substrate terminal of the p-channel MOS transistor.

On one hand, this diode prevents a parasitic transistor being connected to the operating voltage and having a base-to-emitter diode being parallel to the diode of the invention having the low threshold voltage, from switching through. On the other hand, through the diode, the capacitor of the well in which the p-channel MOS transistor is integrated is charged to virtually operating voltage, so that the pump voltage source, which otherwise would have to charge the well capacitor, is less severely strained and therefore reaches its nominal voltage faster.

In accordance with a further feature of the invention, there is provided a second diode being polarized in the conducting direction and being connected between the pump voltage source and the substrate terminal of the p-channel MOS transistor. This second diode decouples the pump-voltage source from the well, and as a result less stringent demands are made of the properties of the first diode.

In accordance with an added feature of the invention, in order to decouple the gate capacitor of the second n-channel MOS transistor from the well capacitor, there is provided a third diode being polarized in the conducting direction and being connected between the substrate terminal of the p-channel MOS transistor and the gate terminal of the second n-channel MOS transistor. This third diode additionally advantageously reduces the gate oxide stress.

In accordance with a concomitant feature of the invention, the three diodes are suitably formed by means of n-channel MOS transistors.

Other features which are considered as characteristic for the invention are set forth in the appended claims.

Although the invention is illustrated and described herein as embodied in a CMOS buffer circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
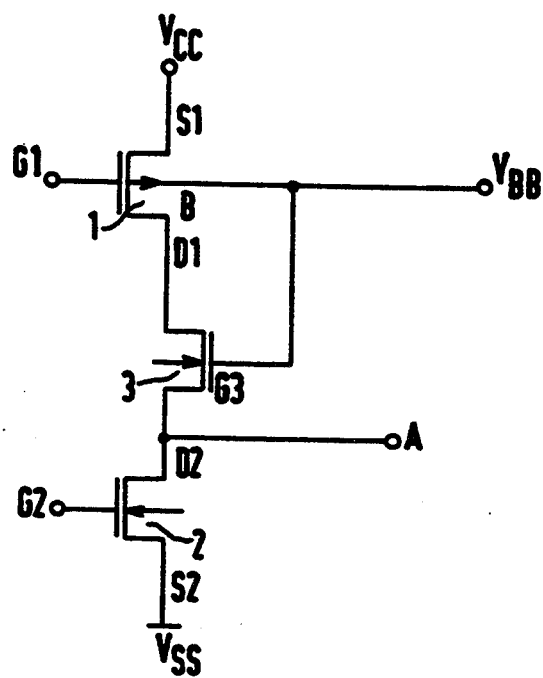
FIG. 1 is a schematic circuit diagram of a first embodiment of a CMOS buffer circuit of the invention.

Referring now to the figures of the drawing in detail and first, particularly, to FIG. 1 thereof, there is seen a CMOS buffer circuit with a p-channel MOS transistor 1, having a source terminal S1 which is connected to an operating voltage source $V_{CC}$. Connected in series with this p-MOS transistor 1 is a first n-channel MOS transistor 2, having a source terminal S2 which is connected to a reference potential $V_{SS}$ and having a drain terminal D2 which is connected to an output terminal A. A second n-channel MOS transistor 3 is disposed between and in series with the PMOS transistor 1 and the NMOS transistor 2. The second n-channel MOS transistor 3 has a gate terminal G3 which, like a substrate terminal B of the PMOS transistor 1, is connected to a pump voltage source $V_{BB}$. Two gate terminals G1, G2 of the PMOS transistor 1 and the first NMOS transistor 2 are shown isolated. However, they may also be connected to one another, which would form a CMOS inverter.

The second NMOS transistor 3 connects the output terminal A to a drain terminal D1 of the PMOS transistor 1, only when the pump voltage source $V_{BB}$, which is fed by the operating voltage $V_{CC}$ has attained its final value. In this way, an overly high or overly low potential at the output terminal A cannot cause firing of a parasitic thyristor, which is created in the substrate as a result of the CMOS circuit shown in FIG. 1.

Figure 2:
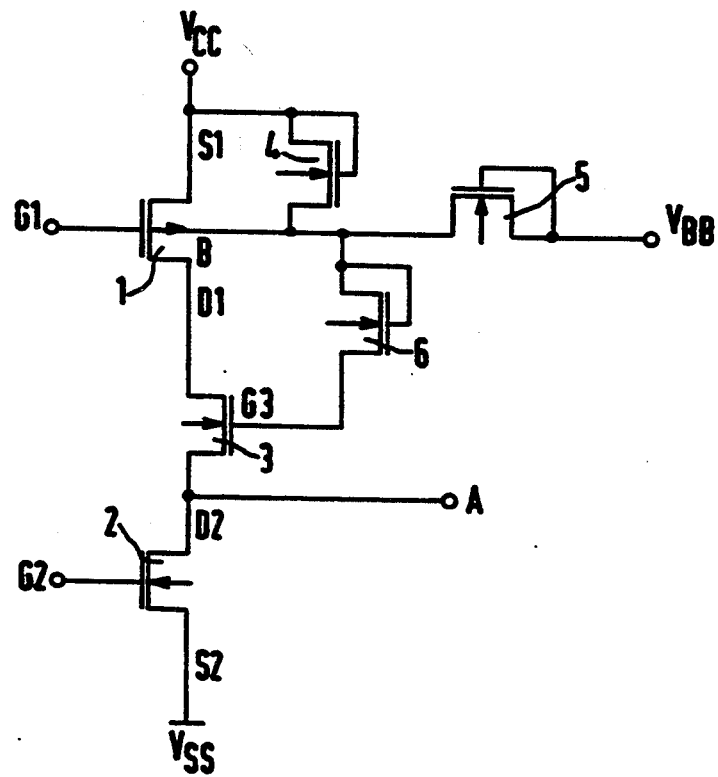
FIG. 2 is a circuit diagram of a second advantageous, expanded version of a CMOS buffer circuit according to the invention.

FIG. 2 shows a further feature of the invention for the CMOS buffer circuit shown in FIG. 1. In FIG. 2, the source terminal S1 of the PMOS transistor 1 is additionally connected to the substrate terminal B through a first diode 4 formed by means of a n-MOS transistor. This diode 4 assures that the well in which the PMOS transistor 1 is formed in the substrate, on which the entire circuit is integrated, is charged by the operating voltage source $V_{CC}$, so that the pump voltage source $V_{BB}$ goes into action faster. Moreover, this first diode 4 prevents a parasitic bipolar transistor from switching through, because its threshold voltage is lower than the base-to-emitter voltage of this parasitic transistor.

Since the pump voltage source $V_{BB}$ is usually formed far away from the buffer circuit on the substrate and therefore is connected to the substrate terminal B over a long line, a second diode 5, that is also formed by an NMOS transistor and is disposed near the substrate terminal B, prevents the capacitor of this line from having to be charged by the operating voltage source $V_{CC}$.

In order to decouple the capacitor of the well from the gate capacitor of the gate G3 of the second NMOS transistor 3, a third diode 6, which is also formed by an NMOS transistor, is disposed between the substrate terminal B of the PMOS transistor 1 and the gate terminal G3 of the second NMOS transistor 3.

I claim:

1. A CMOS buffer circuit, comprising:
   a p-channel MOS transistor having a source terminal connected to an operating voltage source and a substrate terminal connected to a pump voltage source;
   a first n-channel MOS transistor being connected in series with said p-channel MOS transistor and having a source terminal connected to a reference potential and a drain terminal connected to an output terminal; and
   a second n-channel MOS transistor being connected between and in series with said p-channel MOS transistor and said first n-channel MOS transistor, said second n-channel MOS transistor having a gate terminal connected to the pump voltage source.

2. The CMOS buffer circuit according to claim 1, including a diode connected between the source terminal and the substrate terminal of said p-channel MOS transistor, said diode being polarized in the conducting direction and having a low threshold voltage.

3. The CMOS buffer circuit according to claim 2, including another diode connected between the pump voltage source and the substrate terminal of said p-channel MOS transistor, said other diode being polarized in the conducting direction.

4. The CMOS buffer circuit according to claim 2, including a further diode connected between the substrate terminal of said p-channel MOS transistor and the gate terminal of said second n-channel MOS transistor, said further diode being polarized in the conducting direction.

5. The CMOS buffer circuit according to claim 3, including a further diode connected between the substrate terminal of said p-channel MOS transistor and the gate terminal of said second n-channel MOS transistor, said further diode being polarized in the conducting direction.

6. The CMOS buffer circuit according to claim 2, wherein said diode is formed by an n-channel MOS transistor.

7. The CMOS buffer circuit according to claim 3, wherein said diodes are formed by n-channel MOS transistors.

8. The CMOS buffer circuit according to claim 4, wherein said diodes are formed by n-channel MOS transistors.

9. The CMOS buffer circuit according to claim 5, wherein said diodes are formed by n-channel MOS transistors.

* * * * *